United States Patent
Son et al.

(10) Patent No.: US 10,763,242 B2
(45) Date of Patent: Sep. 1, 2020

(54) SEMICONDUCTOR PACKAGE AND METHOD OF MANUFACTURING THE SAME

(71) Applicant: SAMSUNG ELECTRONICS CO., LTD., Suwon-si, Gyeonggi-Do (KR)

(72) Inventors: Young-Hoon Son, Hwaseong-si (KR); Jung-Hwan Choi, Hwaseong-si (KR); Seok-Hun Hyun, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 242 days.

(21) Appl. No.: 15/995,181

(22) Filed: Jun. 1, 2018

(65) Prior Publication Data
US 2018/0374823 A1   Dec. 27, 2018

(30) Foreign Application Priority Data
Jun. 23, 2017 (KR) .................. 10-2017-0079955
Jan. 24, 2018 (KR) .................. 10-2018-0008955

(51) Int. Cl.
*H01L 25/065* (2006.01)
*H01L 23/00* (2006.01)
(Continued)

(52) U.S. Cl.
CPC ........ *H01L 25/0657* (2013.01); *H01L 21/486* (2013.01); *H01L 21/76877* (2013.01); *H01L 23/49827* (2013.01); *H01L 23/5226* (2013.01); *H01L 23/5384* (2013.01); *H01L 24/09* (2013.01); *H01L 24/17* (2013.01); *H01L 25/072* (2013.01); *H01L 25/105* (2013.01); *H01L 23/49816* (2013.01); *H01L 23/5389* (2013.01);
(Continued)

(58) Field of Classification Search
USPC ............... 257/690, 692, 693, 774, E29.119, 257/E23.011, E23.067, E23.145, E23.174, 257/E21.577, E21.585
See application file for complete search history.

(56) References Cited

U.S. PATENT DOCUMENTS 8,680,652 B2   3/2014   Kim et al.
8,754,514 B2   6/2014   Yu et al.
(Continued)

FOREIGN PATENT DOCUMENTS

CN   103904056 A   7/2014

OTHER PUBLICATIONS

Singapore Office Action dated Aug. 30, 2018 corresponding to Singapore Application No. 10201805091V.

*Primary Examiner* — Bo B Jang
(74) *Attorney, Agent, or Firm* — Volentine, Whitt & Francos, PLLC

(57) ABSTRACT

A semiconductor package includes a first layer of one or more first semiconductor chips each having a first surface at which one or more first pads are exposed, a second layer of one or more second semiconductor chips disposed over the first layer and each having a second surface at which one or more second pads are exposed, and a first redistribution layer between the first layer and the second layer and electrically connected to the one or more first pads. The first layer may include one or more first TPVs extending through a substrate (panel) of the first layer and electrically connected to the first redistribution layer.

13 Claims, 16 Drawing Sheets

(51) Int. Cl.
*H01L 23/538* (2006.01)
*H01L 21/48* (2006.01)
*H01L 21/768* (2006.01)
*H01L 23/498* (2006.01)
*H01L 23/522* (2006.01)
*H01L 25/10* (2006.01)
*H01L 25/07* (2006.01)

(52) U.S. Cl.
CPC ........... *H01L 2224/02372* (2013.01); *H01L 2224/02379* (2013.01); *H01L 2225/1047* (2013.01)

(56) References Cited

U.S. PATENT DOCUMENTS

| | | |
|---|---|---|
| 8,878,360 B2 | 11/2014 | Meyer et al. |
| 9,013,892 B2 | 4/2015 | Liu et al. |
| 9,040,412 B2 | 5/2015 | Ma et al. |
| 9,431,450 B2 | 8/2016 | Umebayashi et al. |
| 2008/0136002 A1 | 6/2008 | Yang |
| 2013/0037950 A1 | 2/2013 | Yu et al. |
| 2014/0035156 A1 | 2/2014 | Hsu et al. |
| 2015/0108661 A1 | 4/2015 | Vincent |
| 2016/0155728 A1 | 6/2016 | Zhao et al. |
| 2016/0233169 A1 | 8/2016 | Hunt |
| 2016/0276324 A1 | 9/2016 | Lin et al. |
| 2016/0329299 A1 | 11/2016 | Lin et al. |
| 2016/0351494 A1 | 12/2016 | Chen et al. |
| 2016/0365324 A1* | 12/2016 | Kim .................. H01L 23/5389 |
| 2017/0018527 A1 | 1/2017 | Lee et al. |
| 2017/0092567 A1 | 3/2017 | Vincent et al. |

* cited by examiner

SEMICONDUCTOR PACKAGE AND METHOD OF MANUFACTURING THE SAME

PRIORITY STATEMENT

This application claims the benefit of Korean Patent Application Nos. 10-2017-0079955, filed on Jun. 23, 2017, and 10-2018-0008955, filed on Jan. 24, 2018, in the Korean Intellectual Property Office, the disclosures of which are hereby incorporated by reference in their entirety.

BACKGROUND

The inventive concept relates to a semiconductor package, and more particularly, to a semiconductor package to which a fan-out packaging technique is applied and to a method of manufacturing the same.

Electronic products are required to process large amounts of data while being miniaturized. Accordingly, there is a growing need to increase the integration of semiconductor devices used in such electronic products. To this end, semiconductor chips are being stacked and electrically connected to one another using various packaging technologies. For example, semiconductor packages containing chips are stacked and electrically connected by wires in a process known as a wire bonding process. However, the use of a wire bonding process in this type of application requires the overall semiconductor package be rather thick, and it is difficult to stack more than 4 layers, and T-topology may appear when a redistribution layer is used for more than 2 loads. Recently, panel level package (PLP) and wafer level package (WLP) technologies for increasing integration and reducing unit cost are being researched and developed.

SUMMARY

According to an aspect of the inventive concept, there is provided a semiconductor package including a first layer comprising a first panel of the semiconductor package and one or more first semiconductor chips, each of the one or more first semiconductor chips having one or more first pads exposed at a first surface of the one or more first semiconductor chips, a second layer disposed over the first layer, the second layer comprising a second panel of the semiconductor package and one or more second semiconductor chips, each of the one or more second semiconductor chips having one or more second pads exposed at a second surface of the one or more second semiconductor chips, and a first redistribution layer interposed between the first layer and the second layer and electrically connected to the one or more first pads. The first layer further comprises one or more first through panel vias (TPVs) extending through the first panel in a vertical direction, corresponding to a direction of thickness of the first panel, and electrically connected to the first redistribution layer.

According to another aspect of the inventive concept, there is provided a semiconductor package including a first layer comprising a first semiconductor chip having one or more first pads exposed at a first surface of the first semiconductor chip, a first panel having a first accommodating portion accommodating the first semiconductor chip, and one or more first through panel vias (TPVs) extending through the first panel in a vertical direction corresponding to a direction of thickness of the first panel, a first redistribution layer disposed on the first layer in the vertical direction and electrically connected to the one or more first pads and the one or more first TPVs, and a second layer stacked in the vertical direction on the first redistribution layer and including a second semiconductor chip having one or more second pads exposed at a second surface of the second semiconductor chip, and a second panel including a second accommodating portion accommodating the second semiconductor chip.

According to another aspect of the inventive concept, there is provided a semiconductor package including a first layer comprising a first semiconductor chip having one or more first pads and a first surface at which the one or more first pads are exposed, a first panel having a first accommodating portion accommodating the first semiconductor chip, and one or more first through panel vias (TPVs) extending through the first panel in a vertical direction, a first redistribution layer disposed on the first layer and electrically connected to the one or more first pads and the one or more first TPVs, and a second layer stacked on the first redistribution layer and comprising a second semiconductor chip having one or more second pads and a second surface at which one or more second pads electrically connected to the first redistribution layer are exposed, a second panel comprising a second accommodating portion for accommodating the second semiconductor chip, and a second TPV extending through the second panel and electrically connected to the first redistribution layer.

According to another aspect of the inventive concept, there is provided a semiconductor package including a first panel having opposite sides and one or more chip accommodating portions therein, each of the one or more chip accommodating portions open at one of the opposite sides of the first panel, a respective first semiconductor chip received in each of the one or more chip accommodating portions, the first semiconductor chip having a surface exposed at said one of the opposite sides of the first panel, a redistribution layer (RDL) comprising a wiring pattern extending along said one of the opposite sides of the first panel and over the surface of the first semiconductor chip, the wiring pattern of the RDL being electrically connected to the first semiconductor chip at said surface of the first semiconductor chip, a through panel via (TPV) extending vertically through the first panel from one of the opposite sides thereof to the other of the opposite sides thereof, the wiring pattern of the RDL extending over and electrically connected to the TPV, a second panel disposed directly on the RDL and having one or more chip accommodating portions therein, each of the one or more chip accommodating portions of the second panel open at one of the opposite sides of the second panel, and a respective second semiconductor chip received in each of the one or more chip accommodating portions of the second panel, the second semiconductor chip having a surface exposed at said one of the opposite sides of the second panel. The second semiconductor chip is electrically connected to the wiring pattern of the RDL.

According to another aspect of the inventive concept, there is provided a method of manufacturing a semiconductor package, the method including: forming a first layer by disposing one or more first semiconductor chips each having a first surface on which one or more first pads are exposed and one or more first through panel vias (TPVs) extending through a first panel on the first panel; forming a second layer by disposing one or more second semiconductor chips each having a second surface on which one or more second pads are exposed on a second panel; forming a first redistribution layer electrically connected to the one or more first pads and the one or more first TPVs on the first layer; and forming a first stack structure by stacking the second layer in the vertical direction on the first redistribution layer.

BRIEF DESCRIPTION OF THE DRAWINGS

The inventive concept will be more clearly understood from the following detailed description of examples thereof taken in conjunction with the accompanying drawings in which.

DETAILED DESCRIPTION

A semiconductor package 100 according to the inventive concept will now be described in detail with reference to FIGS. 1A and 1B.

Figure 1A:
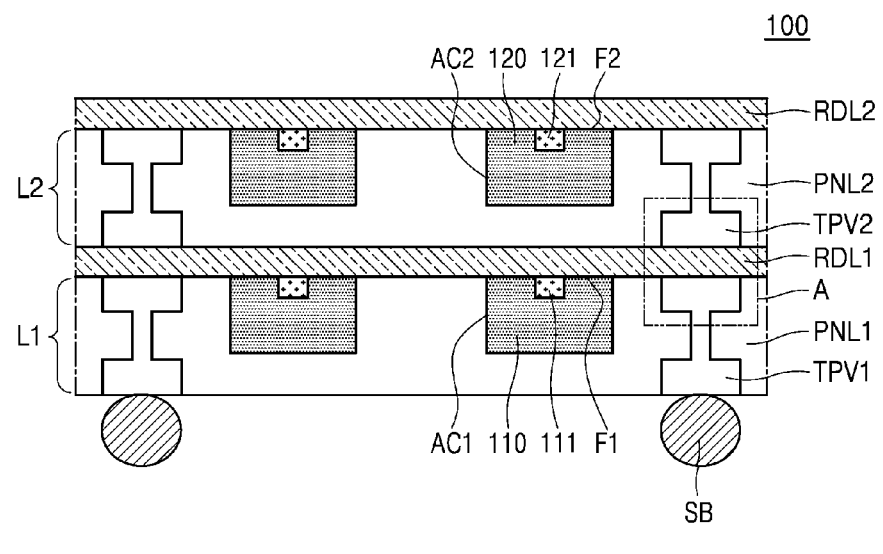
FIG. 1A is a cross-sectional view of an example of a semiconductor package according to the inventive concept.

Referring to FIG. 1A, the semiconductor package 100 may include solder balls SB, first and second layers L1 and L2, and first and second redistribution layers RDL1 and RDL2. A first layer L1 may include one or more first semiconductor chips 110 and one or more first through panel vias (TPV) TPV1. The first layer L1 may also include a first panel PNL1 including a first accommodating portion AC1 in which the first semiconductor chip 110 is accommodated, e.g., a region occupied by the first semiconductor chip 110 in the first panel PNL1. A second layer L2 may include one or more second semiconductor chips 120 and one or more second TPVs TPV2. Furthermore, the second layer L2 may also include a second panel PNL2 including a second accommodating portion AC2 in which the second semiconductor chip 120 is accommodated. Here, the term chip accommodating portion may be understood as referring to a chip-sized opening open at a side of the panel, e.g., a cavity open at only one side of the panel or a through-hole open at both sides of the panel.

The first semiconductor chip 110 may include one or more first pads 111. According to an example, the first semiconductor chip 110 may have a first surface F1 at which the one or more first pads 111 are exposed. For example, the first pad 111 may be exposed at the first surface F1 and electrically connected to the first redistribution layer RDL1. Furthermore, it will be readily understood from the term "chip", that the first semiconductor chip 110 may comprise a die, i.e., a chip body on which an integrated circuit (IC) is formed, and that the one or more first pads 111 is/are the input/output terminal(s) of the IC.

The second semiconductor chip 112 may include one or more second pads 121. According to an example, the second semiconductor chip 120 may have a second surface F2 at which the one or more second pads 121 are exposed. For example, the second pad 121 may be exposed at the second surface F2 and electrically connected to the second redistribution layer RDL2. As with the first semiconductor chip 110, it will be readily understood from the term "chip", that the second semiconductor chip 120 may comprise a die, i.e., a chip body on which an integrated circuit (IC) is formed, and that the one or more first pads 121 is/are the input/output terminal(s) of the IC.

According to an example, the first and second pads 111 and 121 may include a metal. For example, the first and second pads 111 and 121 may be plated pads and may include any one of Au, Ni/Au, and Ni/Pd/Au.

The first and second semiconductor chips 110 and 120 may be, for example, non-volatile memory devices and, more particularly, may be (i.e., are not limited to) EEPROMs, flash memories, phase-change RAMs (PRAMs), resistive RAMs (RRAM)s, ferroelectric RAMs (FeRAMs), solid-state magnetic RAMs (MRAMs), polymer RAMs (PoRAMs), nano floating gate memories (NFGM), or molecular electronics memory devices. Furthermore, the first and second semiconductor chips 110 and 120 may be, for example, volatile memories, and more particularly, may be dynamic random access memories (DRAMs), static random access memories (SRAMs), SDRAMs, or rambus RAMs (RDRAM). That is, the ICs of the first and second semiconductor chips 110 and 120 may comprise an electronic memory and in particular, an array of memory cells.

Furthermore, the first and second semiconductor chips 110 and 120 may be logic chips and may be, for example, controllers for controlling memory chips. That is, the ICs of the first and second semiconductor chips 110 and 120 may comprise logic circuitry.

The first semiconductor chip 110 and the second semiconductor chip 120 may be semiconductor chips of the same or different type. Furthermore, when the first layer L1 (or the second layer L2) includes a plurality of first semiconductor chips 110 (or a plurality of second semiconductor chips 120), some of the first semiconductor chips 110 (or second semiconductor chips 120) may be of the same type of semiconductor chip and the remaining one(s) of the first semiconductor chips 110 (or semiconductor chips 120) may be of a different type of semiconductor chip from those of the same type. The plurality of first semiconductor chips 110 (or the plurality of second semiconductor chips 120) may be disposed close to or in contact with (i.e., adjacent to) the first layer L1 (or the second layer L2) as arrayed in a second direction Y and a third direction Z.

The first TPV TPV1 may extend through the first layer L1 in a first direction X, wherein a first end of the first TPV TPV1 may be electrically connected to the solder ball SB, and a second end of the first TPV TPV1 may be electrically connected to the first redistribution layer RDL1. Furthermore, the second TPV TPV2 may extend through the second layer L2 in the first direction X, wherein a first end of the second TPV TPV2 may be electrically connected to the first redistribution layer RDL1, and a second end of the second TPV TPV2 may be electrically connected to the second redistribution layer RDL2. The solder ball SB may be electrically connected to the first redistribution layer RDL1 via the first TPV TPV1, and the first redistribution layer RDL1 may be electrically connected to the second redistribution layer RDL2 through the second TPV TPV2.

According to an example, the first TPV TPV1 and the second TPV TPV2 may each include at least one of copper (Cu) and tungsten (W). For example, the first TPV TPV1 and the second TPV TPV2 may each include at least one of copper (Cu), copper tin (CuSn), copper magnesium (CuMg), copper nickel (CuNi), copper zinc (CuZn), copper lead (CuPb), copper gold (CuAu), copper rhenium (CuRe), copper tungsten (CuW), and tungsten (W) alloys, but are not limited thereto. For example, the first TPV TPV1 and the second TPV TPV2 may be formed by at least one of processes including electroless plating, electroplating, sputtering, and printing.

The first panel PNL1 may accommodate the one or more first semiconductor chips 110 through one or more first accommodating portions AC1, respectively. Furthermore, the second panel PNL2 may accommodate the one or more second semiconductor chips 120 through one or more second accommodating portions AC2, respectively.

According to an example, the first and second panels PNL1 and PNL2 may include insulation substrates. An insulation substrate may include an insulation material and may include, for example, silicon, glass, ceramic, plastic, or polymer. The first and second panel PNL1 and PNL2 may be implemented to have flat panel rectangular shapes or various other shapes like circular shapes or polygonal shapes.

The first redistribution layer RDL1 may be deposited on the first layer L1 and the second layer L2 may be stacked on the first redistribution layer RDL1. In other words, the first redistribution layer RDL1 may be interposed between the first layer L1 and the second layer L2. Furthermore, the second redistribution layer RDL2 may be deposited on the second layer L2.

The first and second redistribution layers RDL1 and RDL2 may each include a conductive material. The conductive material may include a metal and, for example, may include copper (Cu), a Cu alloy, aluminum (Al), or an Al alloy. The first and second redistribution layers RDL1 and RDL2 may be respectively formed on the first layer L1 and the second layer L2, for example, by a redistribution process.

The first and second redistribution layers RDL1 and RDL2 may respectively form redistribution wiring patterns on the first layer L1 and the second layer L2, facilitating the miniaturizing of input/output terminals of the first and second semiconductor chips 110 and 120, allowing for the number of input/output terminals to be increased, and enabling a fan-out structure. Furthermore, because the first and second redistribution layers RDL1 and RDL2 respectively form redistribution wiring patterns on the first layer L1 and the second layer L2 and a fan-out structure is enabled, the semiconductor package 100 may offer high performance and high-speed signal processing.

Figure 1B:
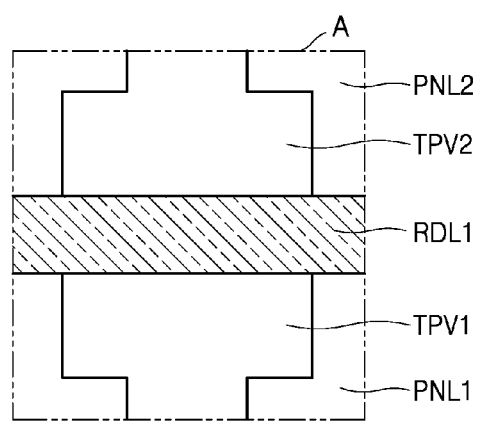
FIG. 1B is an enlarged view of the cross section of region A of the device of FIG. 1.

Referring to FIG. 1B, the first TPV TPV1 and the first redistribution layer RDL1 may be physically/electrically connected to each other, and the first redistribution layer RDL1 and the second TPV TPV2 may be physically/electrically connected to each other. For example, a top surface of the first TPV TPV1 may contact a bottom surface of the first redistribution layer RDL1. According to an example, the top surface of the first TPV TPV1 may lie in substantially the same plane as the bottom surface of the first redistribution layer RDL1, i.e., the first TPV TPV1 and the first redistribution layer RDL1 may have an interface.

Furthermore, a bottom surface of the second TPV TPV2 may contact a top surface of the second redistribution layer RDL2. According to an example, the bottom surface of the second TPV TPV2 may lie in substantially the same plane as the top surface of the second redistribution layer RDL2, i.e., the second TPV TPV2 and the second redistribution layer RDL2 may have an interface.

In a semiconductor package according to the inventive concept, semiconductor chips are electrically connected to one another by TPVs and redistribution layers and without wire bonding. For example, the first semiconductor chips 110 may be electrically connected to one another via the first redistribution layer RDL1. Furthermore, the first and second semiconductor chips 110 and 120 may be electrically connected to each other via the first redistribution layer RDL1, the second TPV TPV2, and the second redistribution layer RDL2. Furthermore, the first and second semiconductor chips 110 and 120 may be electrically connected to an external device via the solder balls SB. Therefore, the number of stacked layers is not limited, and the semiconductor package 100 may be relatively thin.

FIGS. 2A through 2D are partially enlarged cross-sectional views of a semiconductor package according to an example embodiment. For example, FIGS. 2A through 2D may respectively show embodiments of the region A of the semiconductor package 100 of FIG. 1A.

Figure 2A:
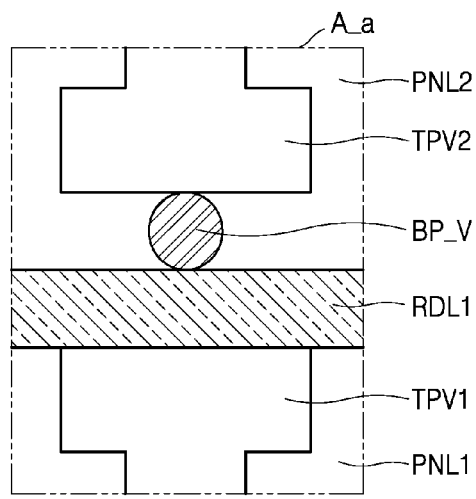
FIGS. 2A, 2B, 2C and 2D are enlarged views of other examples of cross sections of semiconductor packages according to the inventive concept each corresponding to the cross section of region A of the device of FIG. 1.

Referring to FIG. 2A, a discrete bump BP_V of material may be interposed between the first redistribution layer RDL1 and the second TPV TPV2. Although one bump is shown in FIG. 2A, the number of bumps is not limited thereto. A cross section of the bump BP_V may be circular but is not limited thereto. Furthermore, overall the bump BP_V may be spherical, i.e., the bump BP_V may be a ball. The bump BP_V may include Cu, Au, Ni, Al, Ag, or an alloy including at least one of these metals. Therefore, the first redistribution layer RDL1 and the second TPV TPV2 may be electrically connected to each other via the bump BP_V.

Figure 2B:
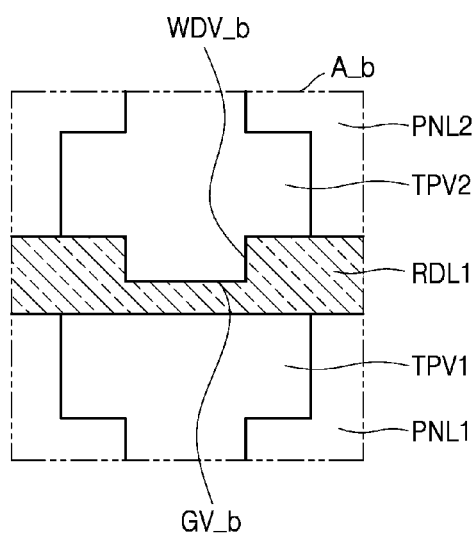

Referring to the example shown in FIG. 2B, the second TPV TPV2 may include a protrusion WDV_b protruding toward the first redistribution layer RDL1. Furthermore, the first redistribution layer RDL1 may include a groove GV_b receiving the protrusion WDV_b. According to an example, the protrusion WDV_b and the groove GV_b may have rectangular cross-sectional and complementary shapes. Although each of FIGS. 2B through 2D shows one protrusion and one groove receiving the protrusion, the numbers of protrusions and grooves are not limited thereto.

Figure 2C:
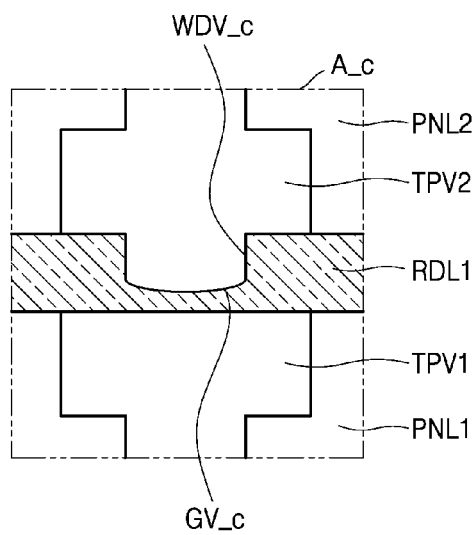

Referring to the example shown in FIG. 2C, the second TPV TPV2 may include a protrusion WDV_c protruding toward the first redistribution layer RDL1. Furthermore, the first redistribution layer RDL1 may include a groove GV_c receiving the protrusion WDV_c. According to this example, a bottom surface of the protrusion WDV_c may has a convex profile, i.e., bulges toward the first redistribution layer RDL1. In other words, the first redistribution layer RDL1 may include the groove GV_c having a concave bottom receiving the protrusion WDV_c having a convex end, and shapes that are complementary.

Figure 2D:
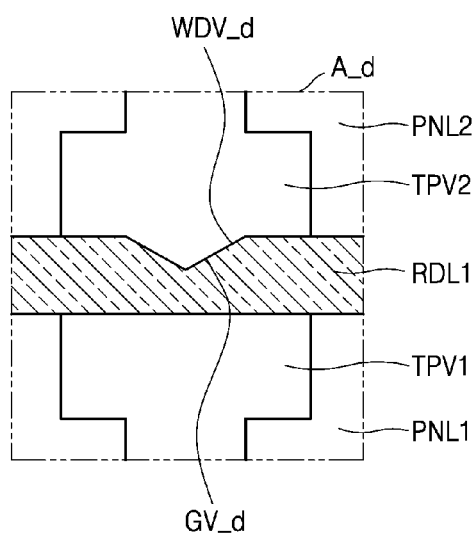

Referring to the example shown in FIG. 2D, the second TPV TPV2 may include a protrusion WDV_d protruding toward the first redistribution layer RDL1. Furthermore, the first redistribution layer RDL1 may include a groove GV_d receiving the protrusion WDV_d. According to this example, the protrusion WDV_d and the groove GV_d have triangular cross-sectional shapes that are complementary.

Figure 3A:
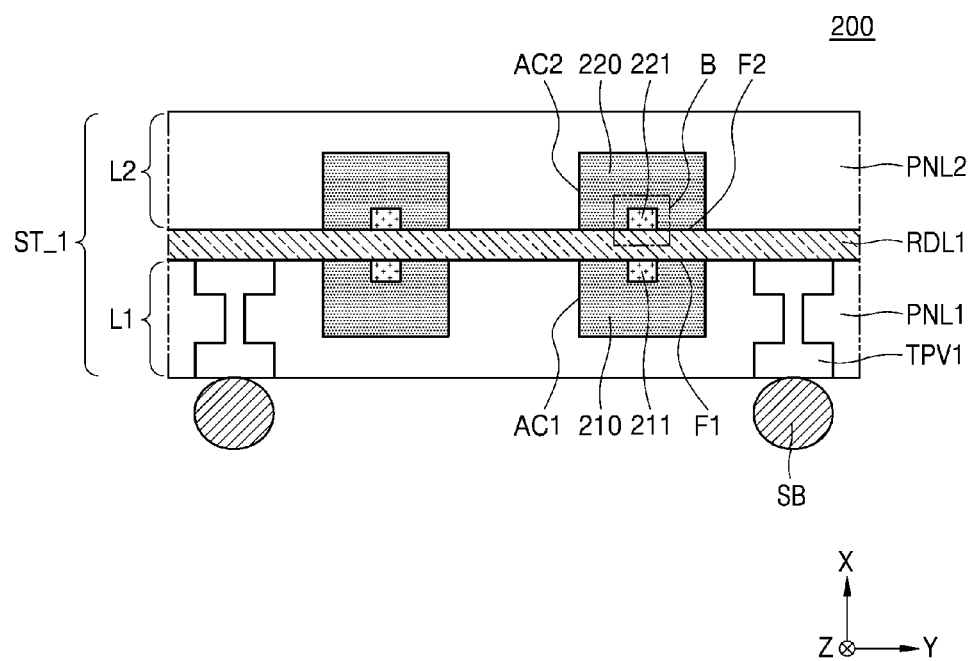
FIG. 3A is a cross-sectional view of an example of a semiconductor package according to the inventive concept.
Figure 3B:
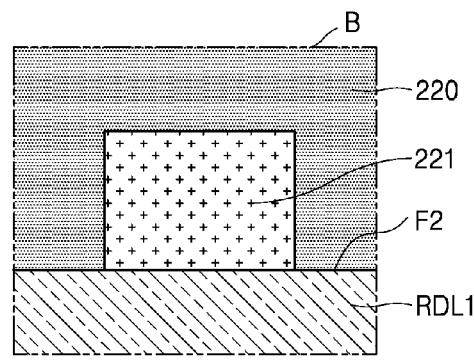
FIG. 3B is an enlarged view of the cross section of region B of the device of FIG. 1.

FIGS. 3A and 3B are diagrams showing the structure of another example of a semiconductor package according to the inventive concept. Components shown in FIGS. 3A and 3B which are identical to those shown in and described above with reference to FIGS. 1A and 1B may not be described again in detail.

Referring to FIG. 3A, the semiconductor package 200 may include solder balls SB, first and second layers L1 and L2, and a first redistribution layer RDL1. The first redistribution layer RDL1 may be interposed between the first layer L1 and the second layer L2, and each solder ball SB may be electrically connected to the first redistribution layer RDL1 via a first TPV TPV1.

According to this example embodiment, a first semiconductor chip 210 and a second semiconductor chip 220 are arranged such that a first surface F1 and a second surface F2 of first semiconductor chip 210 and the second semiconductor chip 220 face each other, i.e., such that the chips 210 and 220 are disposed face-to-face, across the first redistribution layer RDL1. In this respect, the first panel PNL1 and the second panel PNL2 may be arranged such that the first accommodating portion AC1 and the second accommodating portion AC2 face each other across the first redistribution layer RDL1. Furthermore, the first layer L1 and the second layer L2 may be arranged such that the first semiconductor chip 210 and the second semiconductor chip 220 face each other while being symmetrical with respect to the first redistribution layer RDL1, i.e., about a plane intermediate the top and bottom surfaces of the redistribution layer RDL1. Therefore, the first semiconductor chip 210 and the second semiconductor chip 220 may share the first redistribution layer RDL1.

According to another example, a second redistribution layer may be formed on the second layer L2. In this case, the second layer L2 may have one or more second TPVs. According to an example, the bottom surface of the second TPV may contact the top surface of the first second redistribution layer. Furthermore, a third layer including one or more semiconductor chips and/or one or more TPVs may be disposed on the second redistribution layer.

Referring back to FIG. 3B, a second pad 221 may be physically/electrically connected to the first redistribution layer RDL1. Furthermore, the second surface F2 of the second semiconductor chip 220 may contact the top surface of the first redistribution layer RDL1. For example, a bottom surface of the second pad 221 may lie in substantially the same plane as the second surface F2 of the second semiconductor chip 220, i.e., the second semiconductor chip may have an interface with the first redistribution layer RDL1.

In a semiconductor package according to the inventive concept, semiconductor chips may be electrically connected to one another by TPVs and redistribution layers without wire bonding. Therefore, the number of stacked layers is not limited, and the semiconductor package may be relatively thin. Furthermore, as the semiconductor package has a structure in which a plurality of stacked semiconductor chips share a redistribution layer, signal integrity may be improved. Furthermore, a stack structure may be implemented by a redistribution process for a relatively small number of semiconductor chips.

FIGS. 4A through 4D are partially enlarged cross-sectional views of other examples of the portion B of the semiconductor package 200 of FIG. 3A.

Figure 4A:
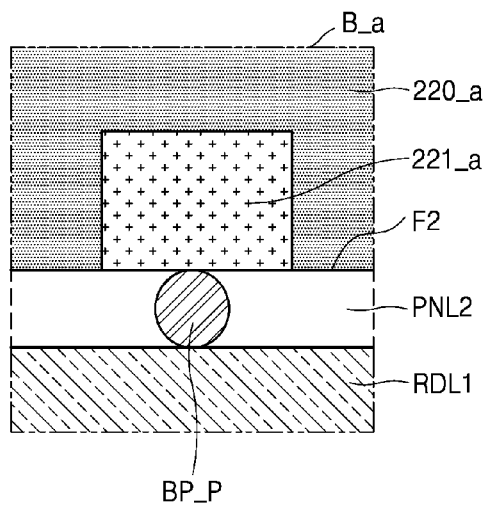
FIGS. 4A, 4B, 4C and 4D are enlarged views of other examples of cross sections of semiconductor packages according to the inventive concept each corresponding to the cross section of region B of the device of FIG. 3B.

Referring to FIG. 4A, a bump BP_P may be interposed between the first redistribution layer RDL1 and a second pad 221_a. Therefore, the first redistribution layer RDL1 and the second pad 221_a may be electrically connected to each other via the bump BP_P. Although one bump is shown in FIG. 4A, the number of bumps is not limited thereto. The bump BP_P may include Cu, Au, Ni, Al, Ag, or an alloy including at least one of these metals.

Figure 4B:
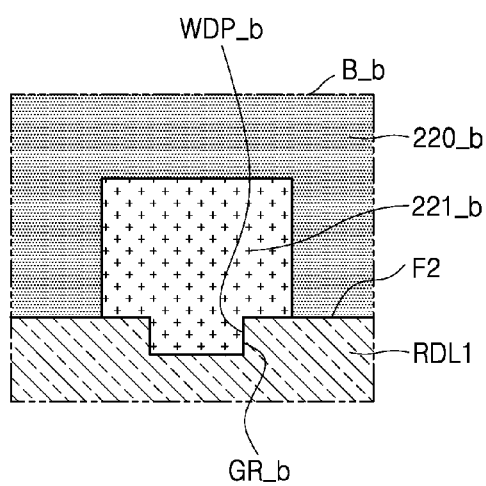

Referring to FIG. 4B, the second pad 221_b may include a protrusion WDP_b protruding toward the first redistribution layer RDL1. Furthermore, the first redistribution layer RDL1 may include a groove GR_b receiving the protrusion WDP_b. According to an example, the protrusion WDP_b and the groove GR_b may have rectangular cross-sectional shapes. As the protrusion WDP_b is inserted into the groove GR_b, the second surface F2 of the second semiconductor chip 220 may contact the top surface of the first redistribution layer RDL1. Although each of FIGS. 4B through 4D shows one protrusion and one groove receiving the protrusion, the numbers of protrusions and grooves are not limited thereto.

Figure 4C:
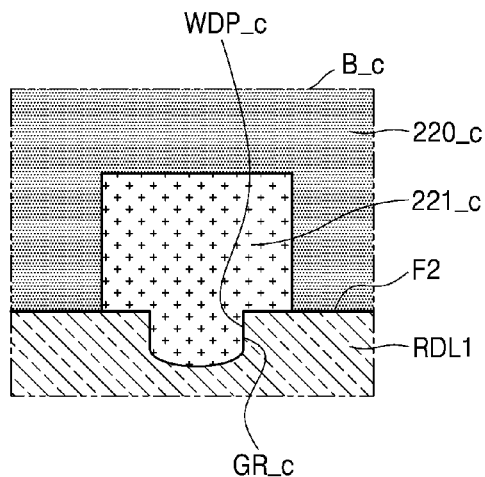

Referring to FIG. 4C, a second pad 221_c may include a protrusion WDP_c protruding toward the first redistribution layer RDL1. Furthermore, the first redistribution layer RDL1 may include a groove GR_c receiving a (complementary) protrusion WDP_c. According to an example, a bottom surface of the protrusion WDP_c facing the first redistribution layer RDL1 may have a convex profile. In other words, the first redistribution layer RDL1 may include the groove GV_c having a bottom surface with a concave profile receiving the protrusion WDV_c whose end surface has a convex profile. As the protrusion WDP_c is inserted into the groove GR_c, the second surface F2 of the second semiconductor chip 220 may contact the top surface of the first redistribution layer RDL1.

Figure 4D:
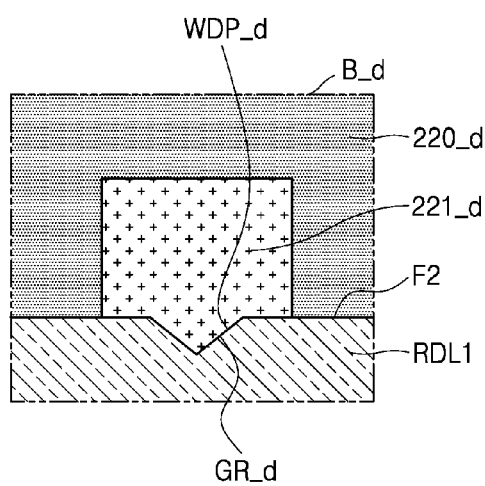

Referring to FIG. 4D, a second pad 221_d may include a protrusion WDP_d protruding toward the first redistribution layer RDL1. Furthermore, the first redistribution layer RDL1 may include a groove GR_d receiving the protrusion WDP_d. According to an example, the protrusion WDP_d and the groove GR_d may have (complementary) triangular cross-sectional shapes. As the protrusion WDP_d is inserted into the groove GR_d, the second surface F2 of the second semiconductor chip 220 may contact the top surface of the first redistribution layer RDL1.

Figure 5:
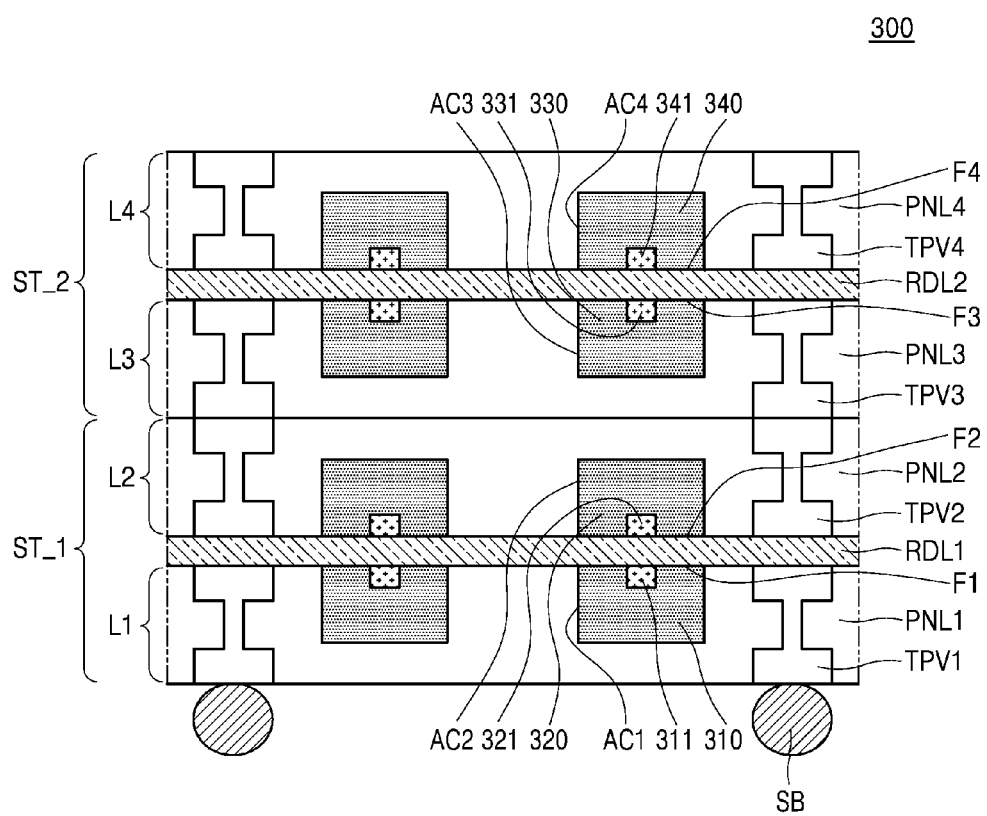
FIG. 5 is a cross-sectional view of an example of a semiconductor package according to the inventive concept.

FIG. 5 is a cross-sectional view of another example of a semiconductor package according to the inventive concept.

Referring to FIG. 5, a semiconductor package 300 may include solder balls SB, a first stack structure ST_1, and a second stack structure ST_2. The second stack structure ST_2 may be stacked in the first direction X on the first stack structure ST_1.

The first stack structure ST_1 may include first layer L1, first redistribution layer RDL1 stacked on the first layer L1, and second layer L2 stacked on the first redistribution layer RDL1. The first layer L1 may include one or more first semiconductor chips 310, a first TPV TPV1 extending through the first layer L1, and first panel PNL1 having first accommodating portion AC1 accommodating the first semiconductor chip 310. Additionally, the second layer L2 may include one or more second semiconductor chips 320, second TPV TPV2 extending through the second layer L2, and second panel PNL2 having second accommodating portion AC2 accommodating the second semiconductor chip 320.

The first semiconductor chip 310 may have a first surface F1 on which a first pad 311 is exposed, and the second semiconductor chip 320 may have a second surface F2 on which a second pad 321 is exposed. According to an example, the first semiconductor chip 310 and the second semiconductor chip 320 may be arranged such that the first surface F1 and the second surface F2 face each other across the first redistribution layer RDL1. The first panel PNL1 and the second panel PNL2 may be arranged such that the first accommodating portion AC1 and the second accommodating portion AC2 face each other across the first redistribution layer RDL1. Still further, the first layer L1 and the second layer L2 may be arranged such that the first semiconductor chip 310 and the second semiconductor chip 320 face each other while being symmetrical with respect to the first redistribution layer RDL1. Therefore, the first semiconductor chip 310 and the second semiconductor chip 320 may share the first redistribution layer RDL1.

The second stack structure ST_2 may include a third layer L3, second redistribution layer RDL2 stacked on the third layer L3, and a fourth layer L4 stacked on the second redistribution layer RDL2. The third layer L3 may include one or more third semiconductor chips 330, a third TPV TPV3 extending through the third layer L3, and a third panel PNL3 having a third accommodating portion AC3 accommodating the third semiconductor chip 330. Furthermore, the fourth layer L4 may include one or more fourth semiconductor chips 340, a fourth TPV TPV4 extending through the fourth layer L4, and a fourth panel PNL4 having a fourth accommodating portion AC4 accommodating the fourth semiconductor chip 340.

The third semiconductor chip 330 may have a third surface F3 at which a third pad 331 is exposed, and the fourth semiconductor chip 340 may have a fourth surface F4 at which a fourth pad 341 is exposed. According to an example, the third semiconductor chip 330 and the fourth semiconductor chip 340 may be arranged such that the third surface F3 and the fourth surface F4 face each other across the second redistribution layer RDL2. The third panel PNL3 and the fourth panel PNL4 may be arranged such that the third accommodating portion AC3 and the fourth accommodating portion AC4 face each other across the second redistribution layer RDL2. Moreover, the third layer L3 and the fourth layer L4 may be arranged such that the third semiconductor chip 330 and the fourth semiconductor chip 340 face each other while being symmetrical with respect to the second redistribution layer RDL2. Therefore, the third semiconductor chip 330 and the fourth semiconductor chip 340 may share the second redistribution layer RDL2.

In other words, the arrangement of the components included in the second stack structure ST_2 may be similar to the arrangement of the components included in the first stack structure ST_1. Furthermore, the second TPV TPV2 and the third TPV TPV3 may be electrically connected to each other. Although not shown in FIG. 5, bumps, protrusions, and the like including a conductive material may be interposed between the second TPV TPV2 and the third TPV TPV3.

In other words, the first, second, and third semiconductor chips 310, 320, 330, and 340 of the first stack structure ST_1 and the second stack structure ST_2 may exchange various signals via the electrical connection between the first stack structure ST_1 and the second stack structure ST_2. Furthermore, when the solder balls SB are electrically connected to a device outside the semiconductor package 300, the first, second, third, and fourth semiconductor chips 310, 320, 330, and 340 may exchange various signals with the device outside the semiconductor package 300.

Figure 6:
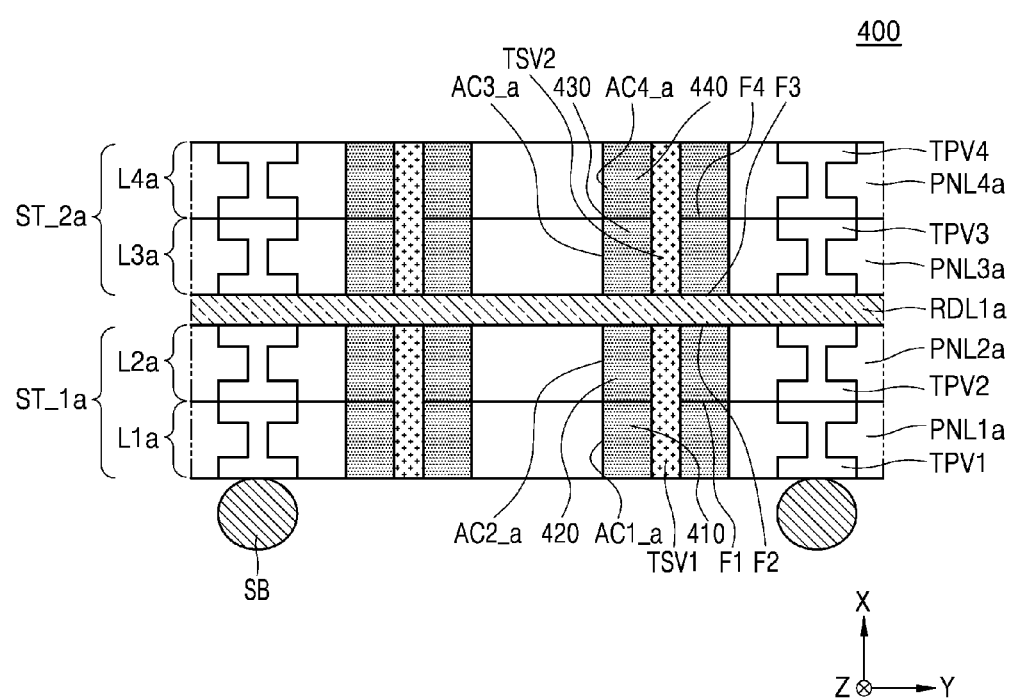
FIG. 6 is a cross-sectional view of an example of a semiconductor package according to the inventive concept.
Figure 7A:
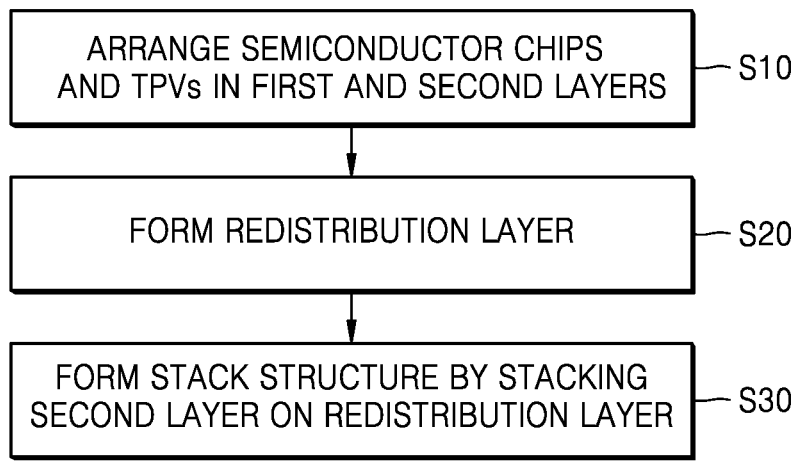
FIGS. 7A through 7D illustrate an example of a process of manufacturing a semiconductor package according to the inventive concept, with FIG. 7A being a flow chart of the process, and FIGS. 7B and 7C each being a cross-sectional view of the components of the package during the course of its manufacture and FIG. 7D being a cross-sectional view of the completed package.
Figure 7B:
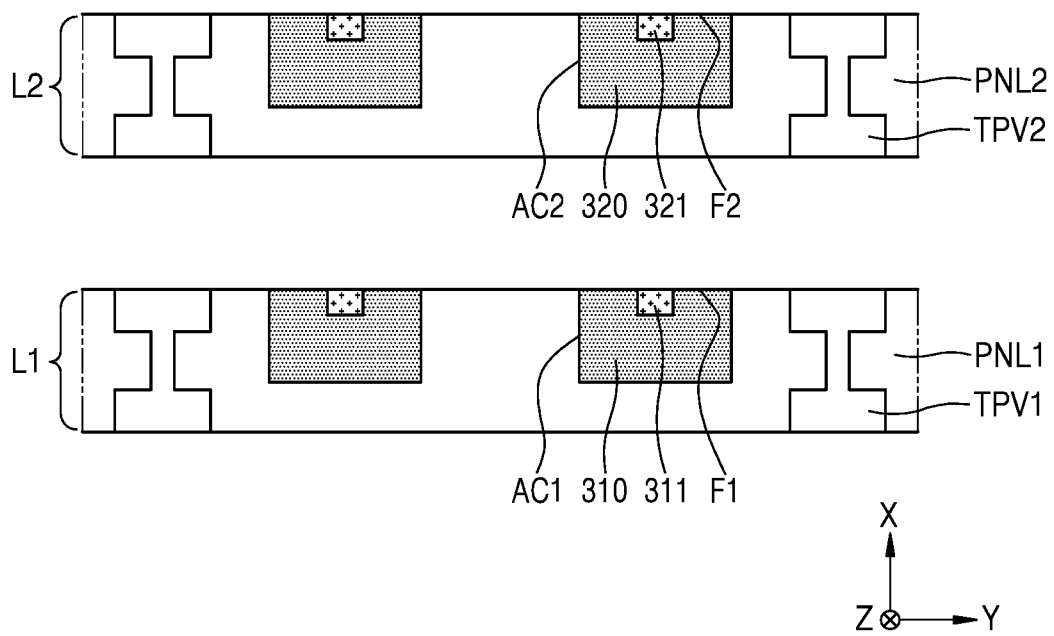
Figure 7C:
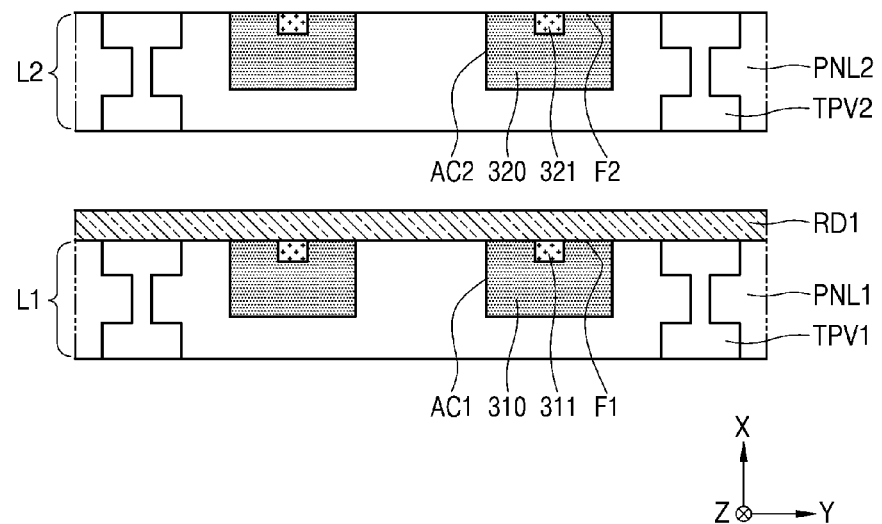
Figure 7D:
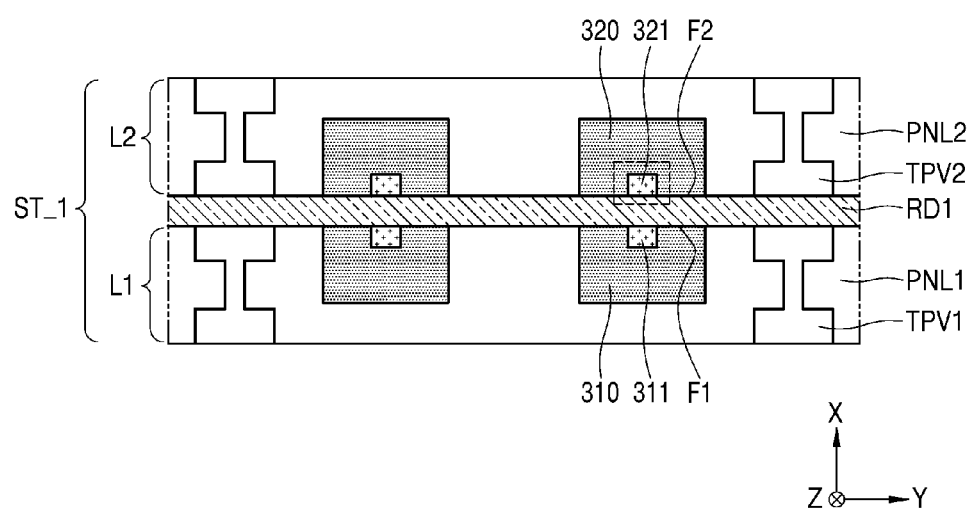
Figure 8A:
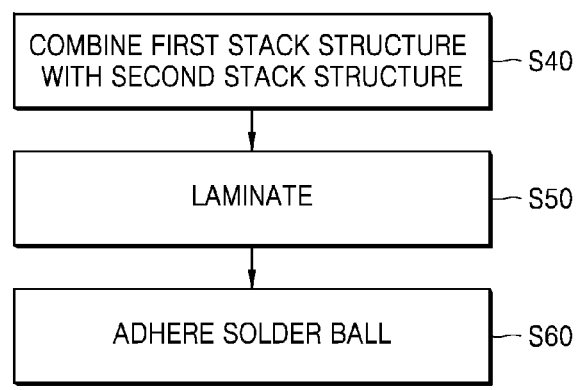
FIGS. 8A through 8D illustrate an example of a process of manufacturing a semiconductor package according to the inventive concept, with FIG. 8A being a flow chart of the process, and FIGS. 8B and 8C each being a cross-sectional view of the package during the course of its manufacture and FIG. 8D being a cross-sectional view of the completed package.
Figure 8B:
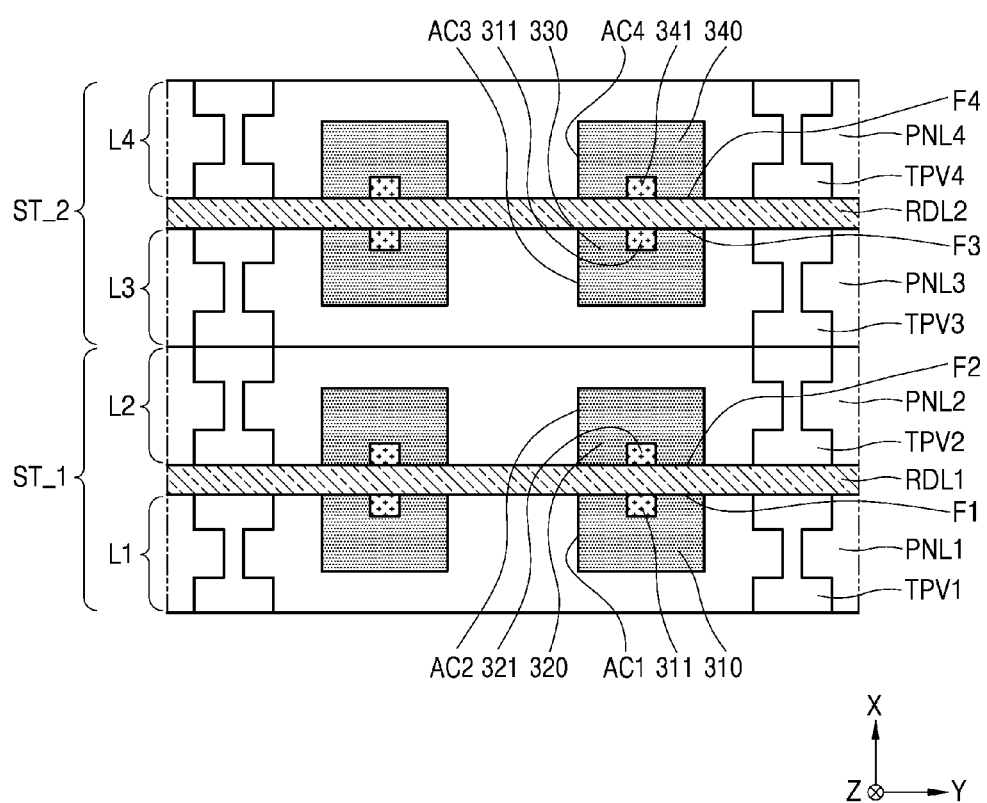
Figure 8C:
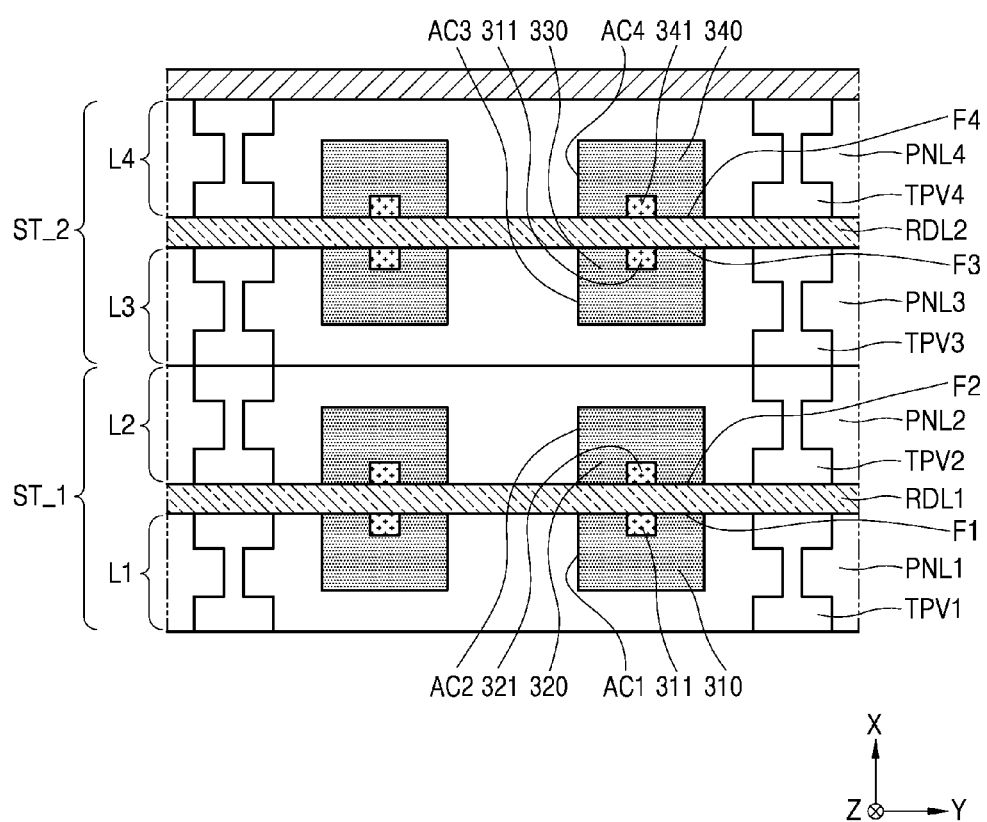
Figure 8D:
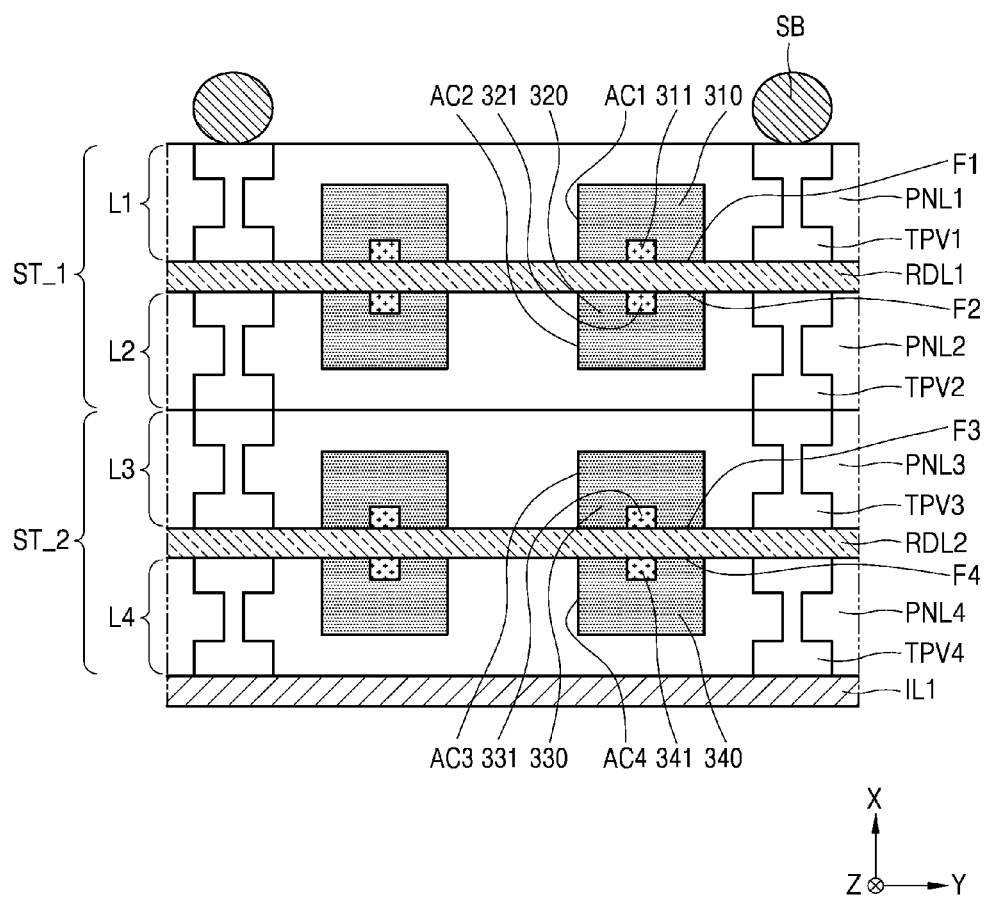

FIG. 6 is a cross-sectional view of another example of a semiconductor package according to the inventive concept.

Referring to FIG. 6, a semiconductor package 400 may include solder balls SB, a first stack structure ST_1a, a second stack structure ST_2a, and a first redistribution layer RDL1a. The second stack structure ST_2a may be stacked in the first direction X on the first stack structure ST_1a. The first redistribution layer RDL1a may be interposed between the first stack structure ST_1a and the second stack structure ST_2a.

The first stack structure ST_1a may include a first layer L1a and a second layer L2a stacked on the first layer L1a. The first layer L1a may include one or more first semiconductor chips 410, first TPV TPV1 extending through the first layer L1a, and a first panel PNL1a having a first accommodating portion AC1_a accommodating the first semiconductor chip 410. The second layer L2a may include one or more second semiconductor chips 420, second TPV TPV2 extending through the second layer L2a, and a second panel PNL2a having a second accommodating portion AC2_a accommodating the second semiconductor chip 420.

According to this example, the first accommodating portion AC1_a and the first panel PNL1a may have the same height or thickness, i.e., the same dimension in the first direction X. Furthermore, the second accommodating portion AC2_a and the second panel PNL2a may have the same height or thickness. That is, the first accommodating portion AC1_a in this example is an opening extending vertically through the first panel PNL1a. Likewise, the second accommodating portion AC2_a in this example is an opening extending vertically through the second first panel PNL2a. Therefore, the first semiconductor chip 410 and the second semiconductor chip 420 may be respectively accommodated in the first accommodating portion AC1_a and the second accommodating portion AC2_a and may have the same dimensions as the first panel PNL1a and the second panel PNL2a in the first direction X, respectively.

Also, according to this example, the first stack structure ST_1a may include one or more through silicon vias (TSVs). In more detail, the first stack structure ST_1a may include one or more first TSVs TSV1 extending through the first stack structure ST_1a in the first direction X. The TSV is electrically connected to the ICs of the chip(s) through which the TSV extends.

For example, first TSV TSV1 may extend through bodies of the first and second semiconductor chips 410 and 420. Alternatively, when the second semiconductor chip 420 includes a pad (not shown) exposed at the second surface F2, the first TSV TSV1 may extend in the first direction X from the pad exposed at the second surface F2 through the remainder of the body of the second semiconductor chip 420 and through the body of the first semiconductor chip 410.

The first TSV TSV1 may include a conductive material. The conductive material may include a metal and, for example, may include at least one of copper (Cu), copper tin (CuSn), copper magnesium (CuMg), copper nickel (CuNi), copper zinc (CuZn), copper lead (CuPb), copper gold (CuAu), copper rhenium (CuRe), copper tungsten (CuW), and tungsten (W) alloys, but is not limited thereto. Although not shown, the first TSV TSV1 may include a conductive plug and a via insulating film surrounding the conductive plug. The via insulating film may include, for example, an oxide film, a nitride film, a carbonized film, a polymer film, or a combination thereof.

The second stack structure ST_2a may include a third layer L3a and a fourth layer L2a stacked on the third layer L3a. The third layer L3a may include one or more third semiconductor chips 430, third TPV TPV3 extending through the third layer L3a, and a third panel PNL3a having a third accommodating portion AC3_a accommodating the third semiconductor chip 430. Furthermore, the fourth layer L4a may include one or more fourth semiconductor chips 440, fourth TPV TPV4 extending through the fourth layer L4a, and a fourth panel PNL4a having a fourth accommodating portion AC4_a accommodating the fourth semiconductor chip 440.

According to this example, the third accommodating portion AC3_a and the third panel PNL3a may have the same height or thickness, i.e., the same dimension in the first direction X. Furthermore, the fourth accommodating portion AC4_a and the fourth panel PNL4a may have the same height or thickness, i.e., the same dimension in the first direction X. Therefore, the third semiconductor chip 430 and the fourth semiconductor chip 440 may be respectively accommodated in the third accommodating portion AC3_a and the fourth accommodating portion AC4_a and may have the same thicknesses as the third panel PNL3a and the fourth panel PNL4a, respectively.

According to this example, the second stack structure ST_2a may include one or more TSVs. In more detail, the second stack structure ST_2a may include one or more second TSVs TSV2 extending through the second stack structure ST_2a in the first direction X.

For example, the second TSV TSV2 may extend through third and fourth semiconductor chips 430 and 440. Alternatively, when the third semiconductor chip 430 includes a pad (not shown) exposed at the third surface F3, the second TSV TSV2 may extend in the first direction X from the pad exposed at the third surface F3 through the remainder of the third semiconductor chip 430 and through fourth semiconductor chip 440.

According to this example, the arrangement of the components of the second stack structure ST_2a may be similar to the arrangement of the components of the first stack structure ST_1a. Furthermore, the first TSV TSV1 and the second TSV TSV2 may be electrically connected to the first redistribution layer RDL1a. Although not shown, bumps, protrusions, and the like including a conductive material may be interposed between the second TPV TPV2 and the first redistribution layer RDL1a.

In other words, the first through fourth semiconductor chips 410, 420, 430, and 440 of the first stack structure ST_1a and the second stack structure ST_2a may exchange various signals via the electrical connection between the first and second TSVs TSV1 and TSV2 of the first through fourth semiconductor chips 410, 420, 430, and 440 and the first redistribution layer RDL1a. Furthermore, when the solder balls SB are electrically connected to a device outside the semiconductor package 400, the first through fourth semiconductor chips 410, 420, 430, and 440 may exchange various signals with the device outside the semiconductor package 400.

FIGS. 7A through 7D illustrate an example of a process of manufacturing a semiconductor package according to the inventive concept. Components of the package similar to those already described, as indicated by like reference numerals, may not be described in detail.

Referring to FIG. 7A through 7D, first and second layers L1 and L2 may be formed by disposing the first and second semiconductor chips 310 and 320 and the TPVs TPV1 and TPV2 in the first and second panels PNL1 and PNL2, respectively (operation S10). For example, the first and second panels PNL1 and PNL2 may each be a portion of different panels or may be different portions of the same panel.

The first layer L1 and/or the second layer L2 may be formed by a wafer level package (WLP) process. Furthermore, the first layer L1 and/or the second layer L2 may be formed by a panel level package (PLP) process.

In the present embodiment, TPVs TPV1 and TPV2 are formed in the first and second panels PNL1 and PNL2, but the inventive concept is not limited thereto. In other words, for example, a TPV may not be formed in the second panel PNL2.

In the illustrated example, though, the first and second TPVs TPV1 and TPV2 are respectively formed in the first and second panels PNL1 and PNL2, and the first and second accommodating portions AC1 and AC2 for respectively accommodating the first and second semiconductor chips 310 and 320 are formed. For example, the first and second accommodating portions AC1 and AC2 are formed by forming cavities in the first and second panels PNL1 and PNL2. After the first and second accommodating portions AC1 and AC2 are formed, the first and second semiconductor chips 310 and 320 may be placed in the cavities, respectively. The first semiconductor chip 310 may have the first surface F1 at which the one or more first pads 311 are exposed. Furthermore, the second semiconductor chip 320 may have the second surface F2 at which the one or more second pads 321 are exposed.

Next, the first redistribution layer RDL1 may be formed on the first layer L1 (operation S20). For example, the first redistribution layer RDL1 may be formed by various deposition processes like sputtering, electroplating, electroless plating, or printing. As a result, the first redistribution layer RDL1 may be electrically connected to the first pad 311 and the first TPV TPV1.

Next, the first stack structure ST_1 may be formed by stacking the second layer L2 on the first redistribution layer RDL1 in the first direction X (operation S30). In this step, the second layer L2 may be stacked on the first redistribution layer RDL1 such that the first surface F1 and the second surface F2 face each other across the first redistribution layer RDL1. Therefore, the first redistribution layer RDL1 may be electrically connected to the first pad 311 and the second pad 321. Furthermore, when the first layer L1 and the second layer L2 have the same configurations, the first layer L1 and the second layer L2 may be symmetric with respect to the first redistribution layer RDL1, i.e., about a plane intermediate the top and bottom surfaces of the first redistribution layer RDL1.

In one example, the top surface of the first redistribution layer RDL1 and the bottom surface of the second pad 321 may each be planar and thus, the first redistribution layer RDL1 and the second pad 321 may be electrically connected to each other only along a substantially planar interface. According to another example, the second pad 321 includes one or more protrusions that protrude toward the first redistribution layer RDL1, and the first redistribution layer RDL1 include one or more grooves receiving the one or more protrusions. According to another example, one or more bumps are formed on the second pad 321 so as to become interposed between the second pad 321 and the first redistribution layer RDL1 when the first redistribution layer RDL1 is formed.

According to an example, the first redistribution layer RDL1 may have a planar top surface and the second TPV TPV2 may have a planar bottom surface, and the first redistribution layer RDL1 is electrically connected to the second TPV TPV2 along these planar surfaces, i.e., along a substantially planar interface. According to another example, the second TPV TPV2 includes one or more protrusions that protrude toward the first redistribution layer RDL1, and the first redistribution layer RDL1 has one or more grooves receiving the one or more protrusions. According to another example, one or more bumps may be formed on the bottom surface of the second TPV TPV2 so as to become interposed between the second TPV TPV2 and the first redistribution layer RDL1.

FIGS. 8A through 8D illustrate another example of a process of manufacturing a semiconductor package according to the inventive concept.

Referring to FIGS. 8A through 8D, the first stack structure ST_1 and the second stack structure ST_2 may be combined with each other (operation S40). For example, the second stack structure ST_2 may be stacked in the first direction X on the first stack structure ST_1.

According to an example, the second stack structure ST_2 may have a structure that is similar to that of the first stack structure ST_1, i.e., may be fabricated by a process similar to the process of fabricating the first stack structure ST_1. For example, the second stack structure ST_2 may include the third layer L3, the second redistribution layer RDL2 formed on the third layer L3, and the fourth layer L4 stacked on the second redistribution layer RDL2. The third and fourth layers L3 and L4 may include the third and fourth semiconductor chips 330 and 340 and the third and fourth TPVs TPV3 and TPV4, respectively.

In the illustrated example, the fourth layer L4 is stacked on the second redistribution layer RDL2 such that the third surface F3 of the third semiconductor chip 330 and the fourth surface F4 of the fourth semiconductor chip 340 face each other across the second redistribution layer RDL2. For example, when the third layer L3 and the fourth layer L4 have the same configurations, the third layer L3 and the fourth layer L4 may be symmetric with respect to the second redistribution layer RDL2. Therefore, the second redistribution layer RDL2 may be electrically connected to the third pad 331 of the third semiconductor chip 330 and the fourth pad 341 of the fourth semiconductor chip 340.

Next, a laminating process for producing a structure in which the first stack structure ST_1 and the second stack structure ST_2 are made integral is performed (operation S50). For example, the laminating process may include applying heat and pressure to a structure in which the second stack structure ST_2 is stacked on the first stack structure ST_1 such that the second stack structure ST_2 is attached to the first stack structure ST_1.

Furthermore, a first insulation layer IL1 may be formed on the second stack structure ST_2. The first insulation layer IL1 may include, for example, an oxide layer, a nitride layer, a polymer layer, or a combination thereof.

Next, solder balls SB may be bonded to the first stack structure ST_1 (operation S60). For example, a solder ball SB may be bonded to the bottom (exposed) surface of each of the one or more first TPVs TPV1. The solder ball SB may provide an electrical connection path between the first and second stack structures ST_1 and ST_2 and an external chip or an external device, for example.

Figure 9:
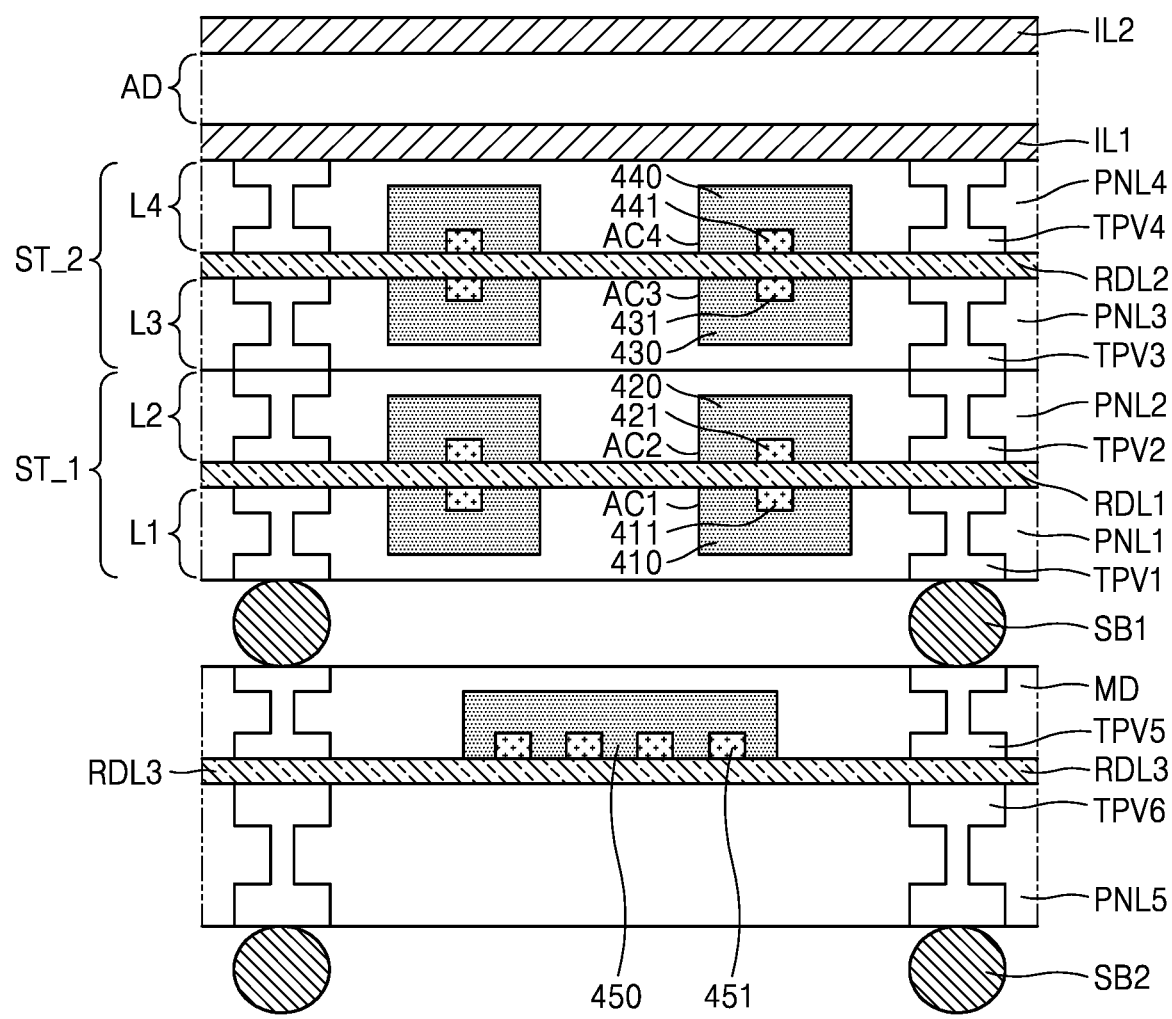
FIG. 9 is a cross-sectional view of an example of a semiconductor package according to the inventive concept.

FIG. 9 shows an example of a semiconductor package 400 according to the inventive concept. Components of the example of FIG. 9 that are identical to those shown in and described above with reference to FIG. 5 may not be described in detail.

Referring to FIG. 9, the semiconductor package 400 includes solder balls SB1 and SB2, a fifth panel PNL5, third redistribution layer RDL3 stacked in the first direction X on the fifth panel PNL5, fifth semiconductor chip 450 electrically connected to the third redistribution layer RDL3 through a fifth pad 451, and a molding layer MD covering the fifth semiconductor chip 450. Furthermore, the semiconductor package 400 may further include a fifth TPV TPV5 that is electrically connected to a solder ball SB1 and the third redistribution layer RDL3 by extending through the molding layer MD, and a sixth TPV TPV6 that is electrically connected to the third redistribution layer RDL3 and a solder ball SB2 by extending through the fifth panel PNL5.

The molding layer MD may encapsulate the fifth semiconductor chip 450 and thereby mold the chip 450 to the fifth panel PNL5. At least a portion of the fifth TPV TPV5 may be exposed through the molding layer MD. The molding layer MD may include a polymer layer such as a resin-based layer. The molding layer MD may include, for example, an epoxy molding compound (EMC).

The fifth semiconductor chip 450 may be a memory chip or a logic chip. For example, when the first through fourth semiconductor chips 410 through 440 are memory chips, the fifth semiconductor chip 450 may include a memory controller for controlling the first through fourth semiconductor chips 410 through 440. The semiconductor package 400 may constitute, for example, a system-on-chip (SoC) or a system-in-package (SIP).

The semiconductor package 400 may further include first insulation layer IL1 a second insulation layer IL2, and an additional layer AD between the first insulation layer IL1 and the second insulation layer IL2. According to an example, the additional layer AD includes an element such as a capacitor or an inductor. Alternatively, the additional layer AD is similar to any of the first through fourth layers L1 through L4, thereby including additional semiconductor chips.

Figure 10:
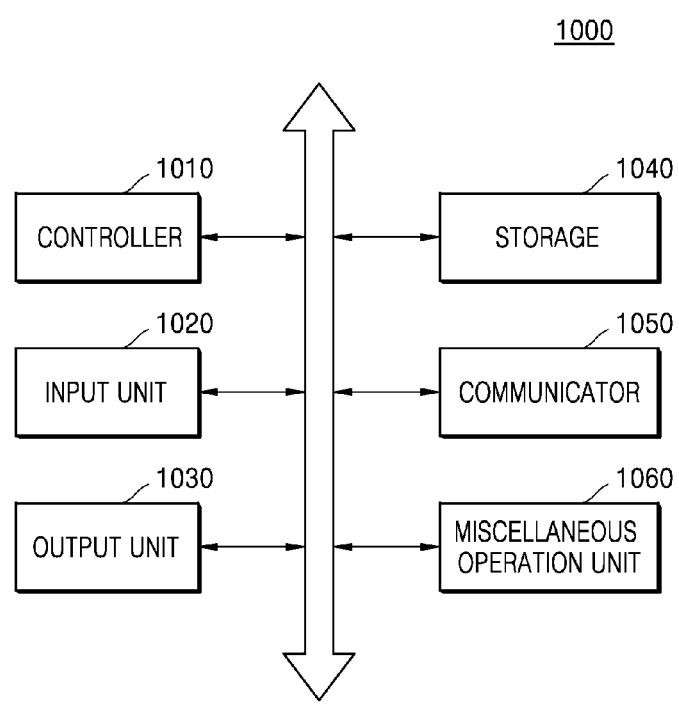
FIG. 10 is a schematic block diagram of an electronic system including a semiconductor package according to the inventive concept.

FIG. 10 illustrates an electronic system 1000 including a semiconductor package according to the inventive concept.

The electronic system 1000 includes a controller 1010, an input unit 1020, an output unit 1030, and a storage 1040, and may further include a communicator 1050 and/or a miscellaneous operation unit 1060.

The controller 1010 may collectively control the electronic system 1000 and its components. The controller 1010 may be a central processing unit or a central controller. The input unit 1020 may output an electrical command signal to the controller 1010. The input unit 1020 may be a keyboard, a keypad, a mouse, a touchpad, an image reader like a scanner, or various input sensors. The output unit 1030 may receive an electrical command signal from the controller 1010 and output results processed by the electronic system 1000. The output unit 1030 may include a monitor, a printer, a beam irradiator, or various mechanical devices.

The storage 1040 may be a component for temporarily or permanently storing an electrical signal processed or to be processed by the controller 1010. The storage 1040 may be physically and electrically connected or combined with the controller 1010. The communicator 1050 may receive an electrical command signal from the controller 1010 and exchange an electrical signal with another electronic system. The miscellaneous operation unit 1060 may perform a physical or mechanical operation in response to a command from the controller 1010.

At least one of the controller 1010, the input unit 1020, the output unit 1030, the storage 1040, the communicator 1050, and the miscellaneous operation unit 1060 includes a semiconductor package of any of the examples shown in and described FIGS. 1A through 9. Therefore, the volume of the electronic system 1000 may be minimal.

Although the inventive concept has been particularly shown and described with reference to various examples thereof, it will be understood that various changes in form and details may be made to such examples without departing from the spirit of the inventive concept and scope of the following claims.

What is claimed is:

1. A semiconductor package comprising:
a first layer comprising a first panel of the semiconductor package and one or more first semiconductor chips, each of the one or more first semiconductor chips having one or more first pads exposed at a first surface of the one or more first semiconductor chips;
a second layer disposed over the first layer, the second layer comprising a second panel of the semiconductor package and one or more second semiconductor chips, each of the one or more second semiconductor chips having one or more second pads exposed at a second surface of the one or more second semiconductor chips; and
a first redistribution layer interposed between the first layer and the second layer and electrically connected to the one or more first pads,
wherein the first layer further comprises one or more first through panel vias (TPVs) extending through the first panel in a vertical direction, corresponding, to a direction of thickness of the first panel, and electrically connected to the first redistribution layer, and
wherein the one or more first semiconductor chips and the one or more second semiconductor chips are disposed such that the first surface and the second surface face each other across the first redistribution layer, and
the one or more second pads are electrically connected to the first redistribution layer,
wherein the first layer further comprises one or more through silicon vias (TSVs) extending in the vertical direction from the one or more first pads through a remainder of respective ones of the one or more first semiconductor chips.

2. The semiconductor package of claim 1, wherein the first panel has one or more cavities therein accommodating the one or more first semiconductor chips, and
the second panel having one or more cavities therein accommodating the one or more second semiconductor chips.

3. The semiconductor package of claim 1, further comprising one or more bumps interposed between the one or more second pads and the first redistribution layer, and
wherein the one or more second pads and the first redistribution layer are electrically connected to each other through the one or more bumps.

4. The semiconductor package of claim 1, wherein the one or more second pads have one or more protrusions protruding toward the first redistribution layer, and
the first redistribution layer has one or more grooves receiving the one or more protrusions.

5. The semiconductor package of claim 1, wherein a top surface of the first redistribution layer is substantially planar, a bottom surface of each of the one or more second pads is substantially planar, and the top surface of the first redistribution layer and the bottom surface of each of the one or more second pads form a substantially planar interface along which the first redistribution layer is electrically connected to the one or more second pads.

6. The semiconductor package, of claim 1, wherein a height of the one or more first semiconductor chips in the vertical direction is equal to a height of the first layer the vertical direction.

7. The semiconductor package of claim 1, wherein the second layer comprises one or more second TPVs extending through the second panel in the vertical direction and electrically connected to the first redistribution layer.

8. A semiconductor package comprising:
a first layer comprising a first semiconductor chip having one or more first pads exposed at a first surface of the first semiconductor chip, a first panel having a first accommodating portion accommodating the first semiconductor chip, and one or more first through panel vias (TPVs) extending through the first panel in a vertical direction corresponding to a direction of thickness of the first panel;
a first redistribution layer disposed on the first layer in the vertical direction and electrically connected to the one or more first pads and the one or more first TPVs; and
a second layer stacked in the vertical direction on the first redistribution layer and including a second semiconductor chip having one or more second pads exposed at a second surface of the second semiconductor chip, and a second panel including a second accommodating portion accommodating the second semiconductor chip,
wherein the first accommodating portion and the second accommodating portion are disposed symmetrically with respect to the first redistribution layer, and
the one or more second pads are electrically connected to the first redistribution layer.

9. The semiconductor package of claim 8, wherein the first layer comprises one or more through silicon vias (TSVs) extending in the vertical direction from the one or more first pads through a body of the first semiconductor chip, and
the second layer comprises one or more through silicon vias (TSVs) extending in the vertical direction from the one or more second pads and through a body of the second semiconductor chip.

10. The semiconductor package of claim 9, wherein the first accommodating portion has a height equal to a thickness of the first panel in the vertical direction.

11. The semiconductor package of claim 8, wherein the second layer comprises one or more second TPVs extending through the second panel in the vertical direction,
further comprising a second redistribution layer disposed on the second layer and electrically connected to the one or more second TPVs.

12. A semiconductor package comprising:
a first panel having one or more chip accommodating portions therein extending through the first panel;
first semiconductor chips respectively received in each of the one or more chip accommodating portions of the first panel;
a redistribution layer (RDL) comprising a wiring pattern extending along a first side of the first panel and over the first semiconductor chips, the wiring pattern of the RDL being electrically connected to the first semiconductor chips;
a first through panel via (TPV) extending vertically through the first panel, the wiring pattern of the RDL extending over and electrically connected to the first TPV;
a second panel disposed directly on a second side of the first panel that is opposite the first side of the first panel, the second panel having one or more chip accommodating portions extending through the second panel;

second semiconductor chips respectively received in each of the one or more chip accommodating portions of the second panel; and one or more through silicon vias (TSVs) electrically connected to the wiring pattern of the RDL, wherein each of the one or more TSVs extends through and each is electrically connected to respective different pairs of a first semiconductor chip from among the first semiconductor chips and a second semiconductor chip from among the second semiconductor chips.

13. The semiconductor package of claim 12, further comprising a second TPV extending vertically through the second panel and electrically connected to the first TPV.

* * * * *